United States Patent [19]

Benoit et al.

[11] Patent Number: 5,716,763
[45] Date of Patent: Feb. 10, 1998

[54] LIQUID IMMERSION HEATING PROCESS FOR SUBSTRATE TEMPERATURE UNIFORMITY

[75] Inventors: Douglas Earl Benoit, Milton; Harold George Linde, Richmond; Denise Marie Puisto; Charles Arthur Whiting, both of Milton, all of Vt.

[73] Assignee: International Business Machines Corporation, Armonk, N.Y.

[21] Appl. No.: 350,444

[22] Filed: Dec. 6, 1994

[51] Int. Cl.⁶ ............................................. G03F 7/26
[52] U.S. Cl. .................. 430/330; 430/311; 427/532
[58] Field of Search ................................. 430/311, 327, 430/330; 261/DIG. 31; 427/532

[56] References Cited

U.S. PATENT DOCUMENTS 5,413,965   5/1995   Webb .................................. 437/219

FOREIGN PATENT DOCUMENTS 58-151016   9/1983   Japan ................................ 437/247
61-174642   8/1986   Japan ................................ 437/247

OTHER PUBLICATIONS

Chen et al., "Study and Verification of Thermal Bake Chuck Models", SRC/SCoE Review (Oct. 13, 1993).

Kaplan & Zimmerman, "Hotplate for Photoresist Baking", *IBM Technical Disclosure Bulletin*, 21 (Jun. 1978).

*Primary Examiner*—Kathleen Duda
*Attorney, Agent, or Firm*—Heslin & Rothenberg, P.C.

[57] ABSTRACT

A temperature-sensitive film such as a resist is baked onto a semiconductor substrate such as a mask blank by immersion in a heated liquid. A barrier coating may optionally be applied to the substrate prior to immersion and later removed. The substrate is subsequently cooled by immersing the substrate in a cooling liquid or dissolving the heated liquid from the substrate with a rinsing liquid at a temperature sufficiently lower than that of the heated liquid. Temperature uniformity within ±0.2° C. is thereby achieved across the regions of varying thickness in the silicon wafer and membrane. Where a resist has been deposited on the mask blank substrate, heating and cooling by immersion results in improved line size control after exposure and development down to 0.25 µm.

27 Claims, No Drawings

LIQUID IMMERSION HEATING PROCESS FOR SUBSTRATE TEMPERATURE UNIFORMITY

TECHNICAL FIELD

The present invention relates to a method for uniformly heating a coated substrate where temperature uniformity in the substrate is important, and more particularly to a method for uniformly baking a layer of temperature-sensitive material onto a semiconductor substrate by immersion into a heated liquid.

BACKGROUND ART

The formation of semiconductor masks such as X-ray masks, ion beam, or electron beam stencil masks requires the baking of a temperature-sensitive film such as an optical photoresist, electron beam resist, or polyimide onto a free-standing membrane. As used herein, the term "membrane" is given its commonly known or conventional meaning and refers to "a thin soft pliable sheet or layer" [*Merriam Webster's Collegiate Dictionary* 724 (10th ed. 1993]. In X-ray mask manufacturing, for example, a layer of resist used in E-beam lithography or photolithography is baked onto a mask blank consisting of a thin (1–3 μm) membrane surrounded by a thicker wafer or ring support.

Difficulty often arises when the technique of hotplate or oven baking is applied to obtain a uniform substrate temperature. "Uniform temperature" as used herein refers to a temperature maintained within ±0.2° C. Intimate contact from the hotplate or oven bake chuck is often not possible over the entire substrate surface due to surface relief, thereby preventing substrate temperature uniformity. For larger hotplates, excessive cost may prohibit their use to hold uniformity to the tolerances required. Also, in hotplate baking where the use of vacuum chucking is necessary to bring the substrate into intimate contact with the hotplate surface, such chucking often induces stresses and distortion on the surface of the substrate.

The difference in thermal time constants due in part to thickness variations between the semiconductor wafer and membrane in the mask blank causes nonuniform heating during baking and cooling. The thermal time constant ($\tau$) is a measure of the time necessary for a body at a given temperature to thermally equilibrate (or how long it takes for a body at a different temperature to thermally equilibrate) with its surroundings and is measured as the product of mass density ($\rho$), heat capacity ($C_p$), and volume (V), divided by the product of the heat transfer coefficient (h) and surface area (A), shown by the equation:

$$\tau = \frac{\rho C_p V}{hA}$$

For the simple case of a planar surface, the equation can be simplified to the product of the mass density ($\rho$), heat capacity ($C_p$), and thickness (L), divided by the heat transfer coefficient (h):

$$\tau = \frac{\rho C_p L}{h}$$

Thus, a lack of temperature uniformity is prevalent when resist layers are baked onto a mask blank substrate having regions of significantly varying thickness. As used herein, the term "nonuniform thermal mass" indicates that varying thermal time constants exist in a substrate between such regions of varying thickness.

Small changes in the time/temperature history of resists can substantially alter image sizes, resulting in lack of image line size control when comparing centers to edges/corners of membranes. A uniform time/temperature history of the resist is especially important with chemically amplified resists because image size control can be drastically affected by only a few degrees difference in temperature. Often substantial line size deviations occur when the temperature is not maintained within one degree tolerance across a silicon wafer. For example, when a resist is baked onto a mask blank, temperature tolerances of ±0.2° C. are required. Likewise, a temperature of ±5° C. must be maintained when a polyimide is applied.

Methods and tools have been developed for reducing the incidence of such lack of temperature uniformity. Both hotplate and oven baking of the E-beam resist have been tried. Neither has been completely successful because the wafer has a larger thermal mass than the membrane and heats and cools much more slowly. Thus, during heating the silicon wafer acts as a heat sink, cooling the edges and especially the corners of the membrane relative to the center. Neither technique is able to deliver sufficient heat at a constant temperature to make the wafer temperature equal to that of the membrane.

Using two common oven bake chuck models, H. Chen, et al. applied a mathematical two dimensional finite element method (FEM) to characterize temperature uniformity in mask membranes during post exposure bake of a chemically amplified resist in order to design an improved bake chuck model. See H. Chen, et al., *Study and Verification of Thermal Bake Chuck Models*, SRC/SCoE Review (Oct. 13, 1993).

In the first bake chuck model, only a 12 mm radius measured from the center of a 40 mm membrane reached an acceptable post-bake temperature between 114° C. and 115° C. during a bake time of 60 seconds. In the second model, a 2° C. increase in temperature at the edge of the membrane was observed due to the thickness of the surrounding wafer. In both models, temperature differences between the center of the membrane and its edges were unacceptable for maintaining image line size control.

Chen then designed a third model and observed a significant improvement in linewidth control as a function of temperature uniformity. However, specific chucks must be designed for each mask configuration.

In addition to heating nonuniformities, cooling may also contribute to lack of image size control. During heating the bulk wafer acts as a heat sink, but during cooling it acts a heat source. Depending upon the ambient cooling conditions, the heat flow from the bulk semiconductor wafer may cause a significant uncontrolled and unrepeatable temperature increase at the edges and corners.

An efficient and inexpensive method of uniformly heating and cooling a layer of temperature-sensitive film deposited onto a semiconductor substrate such as a blank mask is therefore desirable to increase fidelity in image transfer. In addition, such a method would be advantageous to any application where intimate contact from a hotplate or an oven bake chuck is not possible over an entire substrate surface due to surface relief and where temperature uniformity is important.

DISCLOSURE OF INVENTION

The present invention is a method for uniformly heating a temperature-sensitive film onto a semiconductor substrate which eliminates the aforementioned problems of substrate temperature nonuniformity associated with oven baking and hotplate baking by immersing the film-substrate laminate in a heated liquid. As used herein, the terms "immersion" or "immersing" do not limit the method of the present invention to submersion of the entire substrate into a liquid, but also include submerging a portion thereof having a temperature-sensitive film deposited thereon. In addition, the term "semiconductor substrate" as used herein is not intended to limit the substrate to materials used in an active electronic device, but includes any structure made of semiconductor material. It also encompasses substrates employed in the manufacture of semiconductor circuits, such as masks, as well as sensors, which may include silicon nitride or diamond membranes.

The present invention provides a method for baking a resist coating onto a semiconductor mask blank used in lithography. The invention has the advantage of being extremely flexible, inexpensive, efficient, and easy to practice. The substrate comes in direct contact with a heating fluid by immersion, resulting in a uniform temperature throughout the entire substrate. Use of a liquid immersion heating process improves temperature uniformity within ±0.2° C. and thus image size control in semiconductor mask manufacturing where a resist is baked onto a silicon wafer and membrane.

Accordingly, the invention in one of its aspects is a method for uniformly heating a semiconductor substrate of nonuniform thermal mass having a temperature-sensitive film deposited thereon, which comprises immersing said semiconductor substrate in a heated liquid for a time and at a temperature sufficient to obtain a uniform temperature over said substrate, said heated liquid being chemically inert with respect to said temperature-sensitive film and said substrate.

In some applications of the present invention, it is desirable to protect the temperature-sensitive film deposited on the substrate from dissolution or chemical reaction with the heated liquid. Therefore, in another aspect of the present invention, a barrier coating, which is a material chemically inert with respect to both the deposited temperature-sensitive film and the heating solution, may be deposited onto the temperature-sensitive film prior to immersion into the heating liquid. The deposited barrier material acts as a protective barrier coating over the temperature-sensitive film, and the temperature-sensitive film forms an interlayer between the substrate and the barrier coating. Accordingly, a second aspect of the present invention is a method for uniformly heating a semiconductor substrate of nonuniform thermal mass having a temperature-sensitive interlayer deposited thereon, which comprises:

depositing a barrier coating onto the surface of said interlayer; and immersing said semiconductor substrate having said interlayer and said barrier coating in a heated liquid for a time and at a temperature sufficient to obtain a uniform temperature over said substrate, said interlayer, and said barrier coating, said barrier coating being chemically inert with respect to said heated liquid and said interlayer.

Although the invention may be practiced to heat any substrate in which substrate temperature uniformity is important, the present invention is especially applicable where a temperature-sensitive film must be uniformly baked onto a substrate. The film is deposited onto the substrate prior to deposition of the optional barrier coating and prior to immersion into the heating fluid. As stated above, the entire substrate need not be submerged in the heated liquid, but only a portion thereof having the temperature-sensitive film deposited thereon.

An example of such an application is in the fabrication of semiconductor masks such as X-ray masks, ion beam masks, or electron beam masks where a temperature-sensitive film such as a resist, for example, must be baked onto a mask blank substrate consisting of a thin membrane and solid wafer support. Another application for the liquid bake method of the present invention is in the manufacture of a semiconductor mask termed a "SCALPEL" mask (Scattering with Angular Limitation Projection Electron Lithography. A SCALPEL mask, which is quite similar to an X-ray mask, requires a gold image on a thin membrane, but electrons are projected through the mask instead of X-rays. See J. A. Liddle & S. D. Berger, SCALPEL Masks, 14th Annual Bacus Symposium (September 1994).

Application of heat by the liquid immersion method of the present invention effectively overcomes the difference in thermal masses of the wafer and membrane areas; the liquid supplies heat much more rapidly than air or other gases. In addition, the heating liquid fills the gap below the membrane such that the membrane area has the same temperature as the wafer surface. These two effects effectively eliminate temperature gradients across the membrane during baking, thereby improving thermal uniformity. Where a resist has been deposited on the mask blank substrate, heating by immersion results in improved image line size control after exposure and development down to 0.25 μm.

Subsequent cooling of the substrate is accomplished by dissolving the heated liquid with a rinsing liquid having a temperature significantly lower than that of the heated liquid. Alternatively, the substrate may be cooled prior to rinsing by immersion in a cooling liquid held at a temperature significantly lower than that of the heated liquid; the cooling liquid being the same as or different from the heated liquid, but different from the rinsing liquid. When the aforementioned immersion technique is employed in cooling with either the rinsing or cooling liquid, a uniform temperature is reached across the substrate whereby image line size control is maintained.

While the invention has been particularly shown and described with reference to preferred embodiments thereof, it will be understood by those skilled in the art that other changes in form and details may be made therein without departing from the spirit and scope of the invention.

BEST MODE FOR CARRYING OUT THE INVENTION

In both aspects of the present invention, the heated liquid in which the substrate is immersed must have a melting point below the necessary operating point and a high boiling point and high flash point relative to the operating temperature. In addition, the heated liquid must be chemically inert with respect to the temperature-sensitive film deposited on the substrate and the optional barrier coating material. One example of a heating fluid that meets the above requirements is silicone oil (polydimethylsiloxane). A preferred silicone oil is commercially available as Dow Corning 200 Fluid (50 centistoke dimethylpolysiloxane). Another suitable heating liquid is a perfluoroalkylpolyether having a molecular weight from 2400 to 4600 which is commercially available from DuPont as Krytox™ and from Montedison Specialty Chemicals as Fomblin Y VAC 06/6. When the temperature-sensitive film is a resist, paraffin oil mixtures or decahydronaphthalene (Decalin™) may be used. However, the invention is not limited to the use of the aforementioned heating fluids or mixtures thereof, and additional fluids and mixtures will be obvious to those skilled in the art.

In some applications of the present invention, a temperature-sensitive film, such as a resist, is deposited onto the semiconductor substrate prior to immersion into the heated fluid. In X-ray mask manufacturing, for example, an electron beam resist coating such as a positive chemically amplified resist or a positive novolac resist is deposited onto a mask blank. Deposition is preferably done by conventional spin-coating, for example, and the preferred thickness of the deposited resist is between about 500 Å and 3 µm. In other applications of X-ray mask fabrication and in ion beam mask or electron beam mask manufacturing, the coating may be a photoresist, a polyimide, a photoactive polyimide, or spin-on glass, for example, and the preferred thickness of the coating will depend on the coating chosen.

The temperature at which the heated liquid is maintained will vary with the application. Typically, where the substrate is a silicon wafer and membrane onto which a resist has been deposited, temperatures of the heated liquid between about 80° C. and 140° C. are necessary to uniformly bake the resist onto substrate. Immersion into the liquid heating fluid can be done for post-apply bake, post-exposure bake, or both.

The following table provides an exemplary list of temperature-sensitive films that may be deposited onto a silicon wafer and membrane substrate, thickness ranges typical for each film, and typical bake ranges.

| MATERIAL | THICKNESS | BAKE TEMPERATURE |
| --- | --- | --- |
| Polyimide | 0.5–10 µm | 50–400° C. |
| Photoactive polyimide | 0.5–100 µm | 50–400° C. |
| Spin-on glass | 0.1–1.0 µm | 200–400° C. |
| Resist | 500Å–3 µm | 80–140° C. |

The heated liquid will usually be stirred to ensure temperature uniformity in the fluid. Conventional methods of stirring such as magnetic stirring may be used, for example.

The immersion time necessary for substrate temperature uniformity depends on the process to which the invention is applied. When baking a resist layer onto a silicon wafer and membrane substrate, typical immersion times range between about 0.5 and 5.0 minutes.

After the substrate has been immersed in the heating fluid for an appropriate time at a predetermined temperature, the substrate may then be physically removed from the solution. The heating liquid adhering to the substrate is dissolved by rinsing the substrate with a rinsing liquid, typically by immersing the substrate in the rinsing liquid, although the invention is not limited to immersion.

The rinsing liquid must be capable of dissolving the heating fluid but not the substrate and temperature-sensitive film, nor the resist coating where one has been applied. When the rinsing liquid is at a temperature sufficiently lower than that of the heating fluid, such rinsing additionally acts to cool the substrate rapidly and uniformly. Ambient temperatures are generally used. Finally, the rinsing liquid must be relatively volatile to facilitate subsequent drying of the substrate.

N-Heptane or Freon TF™ (trichlorotrifluoroethane) are preferred rinsing liquids. However, the invention is not limited to the use of the aforementioned solvents, and additional rinsing liquids will be obvious to those skilled in the art. After rinsing, the substrate may be blown dry using a nitrogen gun, for example.

Alternatively, the substrate may be cooled by immersing the substrate in a cooling liquid having a temperature sufficiently lower than that of the heated liquid. The cooling liquid is preferably different from the rinsing liquid and may be the same as the heated liquid, in which case the substrate would be cooled prior to dissolving the heated liquid from the substrate with the rinsing liquid.

In the second aspect of the invention, a barrier material is deposited by spin-coating, for example, onto the temperature-sensitive film on the substrate to form a protective coating. The barrier coating must be insoluble in the heating liquid, and the barrier material must be deposited in a solution that does not dissolve or chemically react with either the substrate or the temperature-sensitive film interlayer. Preferred barrier coating choices, although other materials may be used, are polyacrylic acid and polyvinyl alcohol (PVA). These materials exhibit the desirable feature of being soluble in aqueous solutions but insoluble in the preferred heating, rinsing, and cooling fluids. The barrier coating is preferably spun to a thickness between about 500 Å and 2 µm.

The substrate may be cooled by immersion into a cooling liquid at a temperature sufficiently lower than that of the heated liquid or while rinsing the heated liquid from the substrate. The rinsing liquid must dissolve the heating liquid and the cooling liquid where one has been used, but not the barrier coating nor the temperature-sensitive interlayer. Use of n-heptane or Freon TF™ is preferred.

Depending on the application, the barrier coating may optionally be removed after rinsing the heating fluid from the coated substrate before exposure. When the barrier layer is not removed prior to exposure, the barrier-coated substrate may be blown dry using a nitrogen gun, for example. When the barrier coating is removed, the removal solvent must dissolve the barrier but leave the underlying substrate and interlayer unaffected. Water, for example, is the preferred choice as the removal solvent.

The invention is illustrated by the following examples.

GENERAL PROCEDURE

A 100 mm, 625 µm thick <100> silicon wafer with membrane is vapor-primed in hexamethyldisilazane (HMDS) for three minutes. A resist is then spin-coated onto the wafer by static application of the resist to the wafer on an MTI Multifab followed by spinning at the appropriate speed (typically 2500–3500 RPM).

A topcoat barrier material is produced by dissolving 2.0 g of 75% hydrolyzed polyvinyl acetate with a molecular weight of 3000 in 100 mL of water. When employed, the solution of barrier material is statically applied to the resist-coated wafer and spun at 1400 RPM.

A dish 125 mm in diameter and 40 mm deep is placed on a hotplate and filled with the appropriate heating liquid. The temperature is monitored using a thermometer and adjusted to the target temperature of 90±0.2° C. The top of the dish is covered with a 150 mm crystallizing dish to prevent evaporation and improve temperature control. The wafers are baked by completely immersing the coated wafer in the liquid on top of a quartz rack for a predetermined time, typically 0.5–5.0 minutes.

The baked wafers are rinsed by complete immersion in the rinse liquid contained in a 1L rectangular tank. Parts are blown dry with a nitrogen gun.

Exposures are performed on an IBM EL-3+ electron-beam lithography system. Nominal exposure doses are taken from existing processes using conventional oven bakes.

Develop is performed on an APT-314 spray develop system using an aqueous-base developer. Baseline develop times are taken from existing processes using conventional oven bakes.

EXAMPLE 1

The General Procedure is followed without application of a barrier coating to the substrate. The heating liquid is silicone oil, and the rinsing liquid is heptane. High quality images with line sizes down to 0.75 μm are produced.

EXAMPLE 2

The General Procedure is followed without application of a barrier layer to the substrate. The heating liquid is Fomblin oil, and the rinsing liquid is Freon TF™. High quality images with line sizes down to 0.25 μm are produced.

EXAMPLE 3

The General Procedure is followed using polyamic acid to produce a polyimide film in place of the resist.

EXAMPLE 4

The General Procedure is followed using a positive polyhydroxystyrene-type resist, commercially available as APEX-E from Shipley Corp., and polyacrylic acid as the barrier coating.

We claim:

1. A method for uniformly heating a semiconductor substrate of nonuniform thermal mass having a temperature-sensitive film deposited thereon, which comprises immersing said semiconductor substrate in a heated liquid for a time and at a temperature sufficient to obtain a uniform temperature throughout said substrate, said heated liquid being chemically inert with respect to said temperature-sensitive film and said substrate.

2. A method according to claim 1 wherein said heated liquid is polydimethylsiloxane or perfluoroalkylpolyether.

3. A method according to claim 1 wherein said heated liquid is at a temperature in the range of about 50° C. to about 400° C.

4. A method according to claim 1 wherein said semiconductor substrate is immersed for up to about 5.0 minutes.

5. A method according to claim 1 wherein said semiconductor substrate comprises a silicon wafer and membrane.

6. A method according to claim 5 wherein said temperature-sensitive film is an electron beam resist, a photoresist, or a polyimide.

7. A method according to claim 6 wherein said electron beam resist is a positive novolac resist or a positive chemically amplified resist.

8. A method according to claim 1 wherein said substrate is cooled after heating to a temperature lower than that of the heated liquid by immersion in a cooling liquid.

9. A method according to claim 1 wherein said heated liquid is removed from said substrate by dissolving said heated liquid with a rinsing liquid.

10. A method according to claim 9 wherein said rinsing liquid is at a temperature sufficiently lower than that of the heated liquid to cool the substrate.

11. A method according to claim 9 wherein said rinsing liquid is n-heptane or trichlorotrifluoroethane.

12. A method for uniformly heating a semiconductor substrate of nonuniform thermal mass having a temperature-sensitive interlayer deposited thereon, which comprises:

depositing a barrier coating onto the surface of said interlayer; and immersing said semiconductor substrate having said interlayer and said barrier coating in a heated liquid for a time and at a temperature sufficient to obtain a uniform temperature throughout said substrate, said interlayer, and said barrier coating, said barrier coating being chemically inert with respect to said heated liquid and said interlayer.

13. A method according to claim 12 wherein said barrier coating is spin-coated onto said interlayer.

14. A method according to claim 12 wherein said barrier coating is polyacrylic acid or polyvinyl alcohol.

15. A method according to claim 12 wherein said barrier coating has a thickness in the range of about 500 Å to about 2 μm.

16. A method according to claim 12 wherein said heated liquid is polydimethylsiloxane or perfluoroalkylpolyether.

17. A method according to claim 12 wherein said heated liquid is at a temperature in the range of about 50° C. to about 400° C.

18. A method according to claim 12 wherein said semiconductor substrate having said interlayer and said barrier coating is immersed up to about 5.0 minutes.

19. A method according to claim 12 wherein said semiconductor substrate comprises a silicon wafer and membrane.

20. A method according to claim 19 wherein said interlayer is an electron beam resist, a photoresist, or a polyimide.

21. A method according to claim 20 wherein said electron beam resist is a positive novolac resist or a positive chemically amplified resist.

22. A method according to claim 12 wherein said substrate is cooled after heating by immersion in a cooling liquid at a temperature sufficiently lower than that of the heated liquid.

23. A method according to claim 12 wherein said heated liquid is removed from said deposited barrier coating by dissolving said heated liquid with a rinsing liquid.

24. A method according to claim 23 wherein said rinsing liquid is at a temperature sufficiently lower than that of the heated liquid to cool the substrate.

25. A method according to claim 23 wherein said rinsing liquid is n-heptane or trichlorotrifluoroethane.

26. A method according to claim 23 wherein said barrier coating is removed from said interlayer by dissolving said barrier coating with a removal solvent after said heated liquid is removed from said barrier coating.

27. A method according to claim 26 wherein said removal solvent is water.

* * * * *